(12) United States Patent  (10) Patent No.: US 8,729,380 B2
Stefan et al.  (45) Date of Patent: May 20, 2014

(54) USE OF POROUS METALLIC MATERIALS AS CONTACT CONNECTION IN THERMOELECTRIC MODULES

(75) Inventors: Madalina Andreea Stefan, Ludwigshafen (DE); Alexander Traut, Schriesheim (DE)

(73) Assignee: BASF SE, Ludwigshafen (DE)

( * ) Notice: Subject to any disclaimer, the term of this patent is extended or adjusted under 35 U.S.C. 154(b) by 575 days.

(21) Appl. No.: 12/938,699

(22) Filed: Nov. 3, 2010

(65) Prior Publication Data

US 2011/0099991 A1  May 5, 2011

(30) Foreign Application Priority Data

Nov. 3, 2009  (EP) .................................... 09174855

(51) Int. Cl.
*H01L 35/30* (2006.01)
*H01L 35/02* (2006.01)
*H01L 35/04* (2006.01)

(52) U.S. Cl.
CPC ..................................... *H01L 35/04* (2013.01)
USPC .......................................... 136/205; 136/230

(58) Field of Classification Search
CPC ................................ H01L 35/02; H01L 35/04
USPC ......... 136/200, 203, 205, 207, 208, 209, 230; 60/320
See application file for complete search history.

(56) References Cited

U.S. PATENT DOCUMENTS

| | | | | |
|---|---|---|---|---|
| 2,980,746 A * | 4/1961 | Claydon | ......................... | 136/203 |
| 3,269,872 A * | 8/1966 | Thompson | ..................... | 136/208 |
| 3,617,390 A * | 11/1971 | De Bucs et al. | ................ | 136/211 |
| 3,714,539 A * | 1/1973 | Hampl, Jr. | ...................... | 322/2 R |
| 4,036,665 A * | 7/1977 | Barr et al. | ....................... | 136/202 |
| 4,611,089 A | 9/1986 | Elsner et al. | | |
| 5,439,528 A | 8/1995 | Miller | | |
| 5,448,109 A | 9/1995 | Cauchy | | |
| 6,444,894 B1 | 9/2002 | Sterzel | | |
| 6,700,052 B2 * | 3/2004 | Bell | .............................. | 136/201 |
| 2006/0266404 A1 * | 11/2006 | Hiller et al. | .................... | 136/205 |
| 2009/0004086 A1 | 1/2009 | Kuhling et al. | | |
| 2009/0014046 A1 * | 1/2009 | Yu et al. | ......................... | 136/200 |
| 2010/0229911 A1 * | 9/2010 | Leavitt et al. | .................. | 136/239 |

FOREIGN PATENT DOCUMENTS

| | | |
|---|---|---|
| EP | 1102334 A2 | 5/2001 |
| WO | WO-98/44562 A1 | 10/1998 |
| WO | WO-2007/077065 A1 | 7/2007 |

OTHER PUBLICATIONS

Elsner, N.B., "Reveiw of Lead-telluride Bonding Concepts," Mat. Res. Soc. Symp. Proc., 1991, vol. 234, pp. 167-175.

* cited by examiner

*Primary Examiner* — Eli Mekhlin
(74) *Attorney, Agent, or Firm* — Novak Druce Connolly Bove + Quigg LLP

(57) ABSTRACT

In the thermoelectric module composed of p- and n-conductive thermoelectric material legs which are connected to one another alternately via electrically conductive contacts, at least some of the electrically conductive contacts on the cold and/or the warm side of the thermoelectric module are formed between, or embedded into, the thermoelectric material legs composed of porous metallic materials.

4 Claims, 2 Drawing Sheets

USE OF POROUS METALLIC MATERIALS AS CONTACT CONNECTION IN THERMOELECTRIC MODULES

PRIORITY

Priority is claimed under 35 U.S.C. §119 to European patent application No. 09174855.8, filed Nov. 3, 2009. The disclosure of the aforementioned priority document is incorporated herein by reference in its entirety.

DESCRIPTION

The invention relates to thermoelectric modules which are suitable for application to uneven, solid heat carrier surfaces.

Thermoelectric generators and Peltier arrangements as such have been known for some time. p- and n-doped semiconductors which are heated on one side and cooled on the other side transport electrical charges through an external circuit, and electrical work can be performed by a load in the circuit. The efficiency of conversion of heat to electrical energy achieved in this process is limited thermodynamically by the Carnot efficiency. Thus, at a temperature of 1000 K on the hot side and 400 K on the "cold" side, an efficiency of (1000−400): 1000=60% would be possible. However, only efficiencies of up to 10% have been achieved to date.

On the other hand, when a direct current is applied to such an arrangement, heat is transported from one side to the other side. Such a Peltier arrangement works as a heat pump and is therefore suitable for cooling apparatus parts, vehicles or buildings. Heating via the Peltier principle is also more favorable than conventional heating, because more heat is always transported than corresponds to the energy equivalent supplied.

At present, thermoelectric generators are used in space probes for generating direct currents, for cathodic corrosion protection of pipelines, for energy supply to light buoys and radio buoys and for operating radios and television sets. The advantages of thermoelectric generators lie in their extreme reliability. For instance, they work irrespective of atmospheric conditions such as air humidity; there is no fault-prone mass transfer, but rather only charge transfer; the fuel is combusted continuously, and catalytically without a free flame, as a result of which only small amounts of CO, $NO_x$ and uncombusted fuel are released; it is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

BRIEF DESCRIPTION OF THE DRAWINGS

A thermoelectric module consists of p- and n-legs, which are connected electrically in series and thermally in parallel. FIG. 1 shows such a module.

The conventional construction consists of two ceramic plates between which the individual legs are arranged in alternation. Every two legs are conductively connected to electrical contacts via the end faces.

In addition to the electrically conductive contacting, different further layers are normally also applied to the actual material, which serve as protective layers or as solder layers. Ultimately, electrical contact is established between two legs, however, via a metal bridge.

Figure 2:
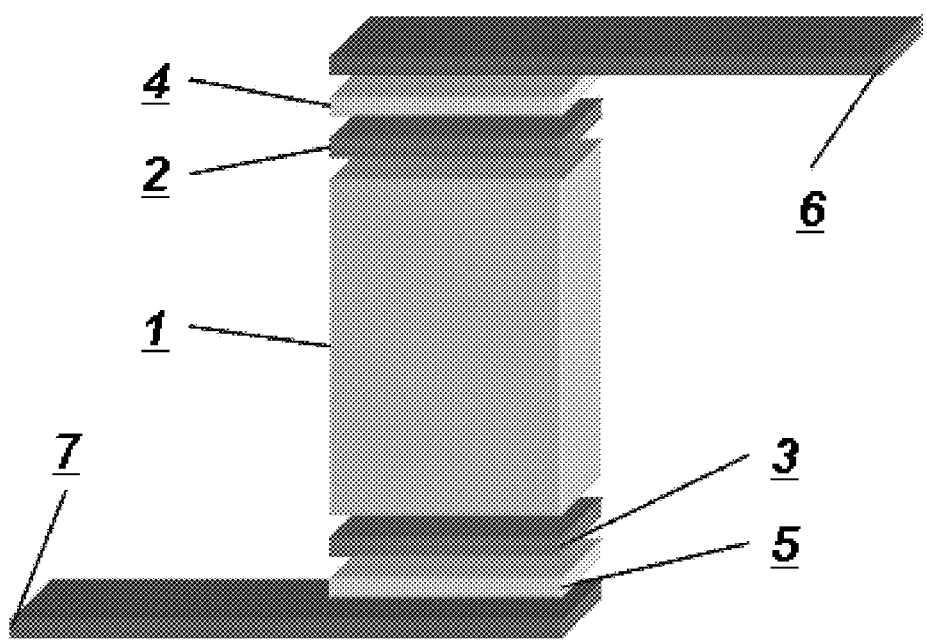
FIG. 2 schematically illustrates the structure of a thermoelectric component, including the contact connection.

An essential element of thermoelectric components is the contact connection. The contact connection establishes the physical connection between the material in the "heart" of the component (which is responsible for the desired thermoelectric effect of the component) and the "outside world". The structure of such a contact connection in detail is shown schematically in FIG. 2.

The thermoelectric material 1 within the component is responsible for the actual effect of the component. This is a thermoelectric leg. An electrical current and a thermal current flow through the material 1, in order that it fulfills its purpose in the overall structure.

The material 1 is connected to the supply lines 6 and 7 via the contacts 4 and 5, on at least two sides. The layers 2 and 3 are intended to symbolize one or more intermediate layers which may be necessary (barrier material, solder, adhesion promoter or the like) between the material 1 and the contacts 4 and 5. The layers 2/3, 4/5 may, but need not always, be present. The use thereof depends on the TE material used and the particular application. The segments 2/3, 4/5, 6/7, each of which correspond to one another in pairs, however, need not be identical. This depends ultimately on the specific structure and the application, just like the flow direction of electrical current or thermal current through the structure.

An important role is assumed by the contacts 4 and 5. These ensure a close connection between material and supply line. When the contacts are poor, high losses occur here, which can severely restrict the performance of the component. For this reason, the contacts are frequently also pressed onto the material. The contacts are thus subjected to high mechanical stress. This mechanical stress increases as soon as elevated (or else reduced) temperatures or/and thermal cycling play a role. The thermal expansion of the materials incorporated into the component leads inevitably to mechanical stress, which leads in the extreme case to failure of the component as a result of detachment of the contact.

In order to prevent this, the use of contacts with a certain flexibility and spring properties would be ideal, in order that such thermal stresses can be balanced out.

In order to impart stability to the whole structure and ensure the necessary, substantially homogeneous thermal coupling over the total number of legs, carrier plates are needed. For this purpose, a ceramic is typically used, for example composed of oxides or nitrides such as $Al_2O_3$, $SiO_2$ or AlN.

This typical structure entails a series of disadvantages. The ceramic and the contacts are only of limited mechanical durability. Mechanical and/or thermal stresses can easily lead to cracks or breakdown of the contact connection, which makes the entire module unusable.

In addition, limits are placed on the conventional structure with regard to application too, since only planar surfaces can ever be connected to the thermoelectric module. A close connection between the module surface and the heat source/heat sink is indispensible in order to ensure sufficient heat flow.

Nonplanar surfaces, for example a round waste heat tube, are not amenable to direct contact with the conventional module, or require a corresponding straightened heat exchanger structure, in order to provide a transition from the nonplanar surface to the planar module.

Figure 1:
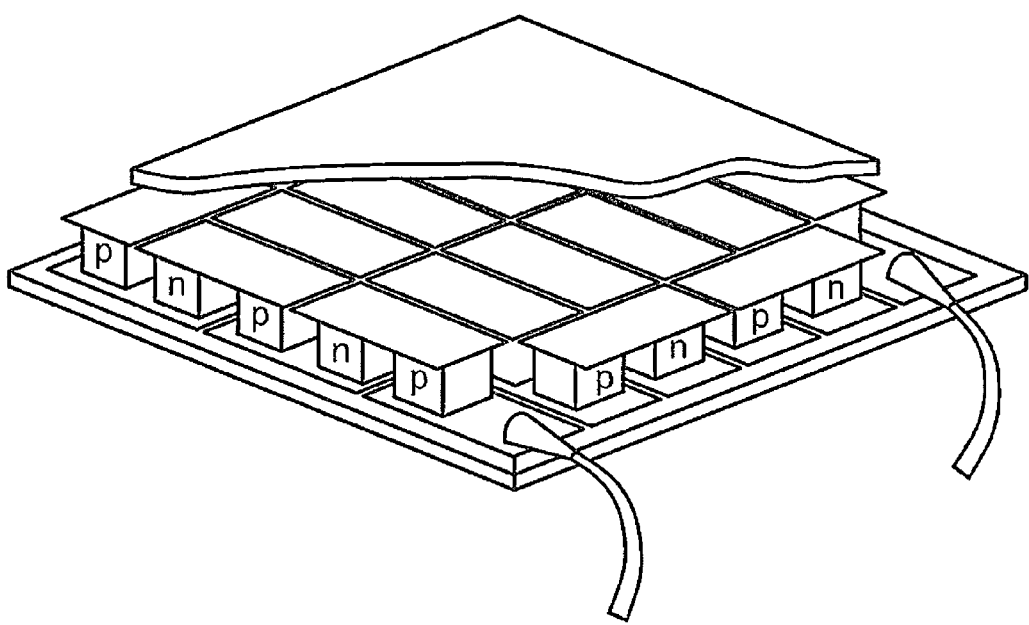
FIG. 1. illustrates a thermoelectric module.

The contact connection in the thermoelectric modules is generally rigid. Mat. Res. Soc. Symp. Proc. Vol. 234, 1991, pages 167 to 177 describes lead telluride application concepts. FIG. 1 of this document shows a contact connection in which, on the cold side of the thermoelectric module, the contact exhibits a U-shaped indentation. On the warm side of the module, contacts are connected by rigid contacts. This manner of contact connection too does not allow use on nonplanar surfaces.

U.S. Pat. No. 4,611,089 describes a thermoelectric converter which comprises n- and p-conductive thermoelectric materials in different compartments. Each material in each compartment is connected thermally to a substrate with a thermally conductive metal fiber pad.

It is an object of the present invention to provide thermoelectric modules which can be matched flexibly to nonplanar heat carrier surfaces and react flexibly to thermal and mechanical stress. The contact connection should ensure a good thermal connection of the thermoelectric material to the electrically insulated substrate.

The object is achieved in accordance with the invention by a thermoelectric module composed of p- and n-conductive thermoelectric material legs which are connected to one another alternately via electrically conductive contacts, wherein at least some of the electrically conductive contacts on the cold and/or the warm side of the thermoelectric module are formed between, or embedded into, the thermoelectric material legs composed of porous metallic materials. By virtue of the porous metallic material, the thermoelectric material legs have flexibility sites in the profile thereof, which allow bending and slight displacement of the thermoelectric material legs with respect to one another, and also compression and relaxation.

The expression "flexibility site" describes a site in the profile of the electrical contact which allows bending or displacement of the contact connected to the p-leg and n-leg. The two material legs should be slightly displaceable and compressible with respect to one another. The term "slightly" describes a displacement or compression by not more than 20%, more preferably not more than 10% of the distance between the particular p- and n-conductive, thermoelectric material legs, or the leg height. The possibility of bending ensures that the contact connection does not tear off from any of the material legs when the thermoelectric module is aligned to a nonplanar surface or is subjected to thermal expansion and/or mechanical stress.

The porous metallic materials may have any desired shape, the porosity ensuring sufficient mechanical flexibility of the metallic materials. The porous metallic materials used in accordance with the invention may, for example, be metal foams, metal nonwovens, metal wovens or metal knits.

The term "metal foam" describes electrically conductive contacts made of metal, said metal having a certain porosity, i.e. comprising cavities which are delimited from one another by walls. Thus, the term "metal foam" should be interpreted broadly and should not be restricted to a production process by foaming a liquid metal and solidifying the foam. The metal foam can be produced by any suitable process which leads to the formation of a porous structure. The metal foam should be configured such that there is a certain bendability, displaceability and compressibility of the contacts. The porosity can additionally increase the contact surface area.

Metal nonwovens, metal wovens or metal knits can be produced, for example, from nanowires or nanotubes by electrospinning. Suitable electrospinning processes for producing very thin metal wires are described, for example, in EP-B-1 969 166 and WO 2007/077065. The wires used for the production preferably have a diameter of less than 1 mm, more preferably of less than 0.5 mm, especially of less than 0.1 mm. Under suitable conditions, electrospinning may result directly in crosslinking of the spun fibers, or in the formation of porous fiber structures. It is also possible subsequently to obtain metal nonwovens, metal wovens or metal knits from the fibers produced, by appropriate aftertreatment and processing. More particularly, woven, knitted or crosslinked fibers are present. The metal nonwovens, metal wovens or metal knits can also be produced by foaming, rolling or pressing or twisting the fibers. Typically, electrospinning is effected by spinning metal salt solutions and subsequent reduction.

The porous metallic materials used in accordance with the invention are thus preferably metal foams, metal nonwovens, metal wovens or metal knits.

Bending should preferably be possible by an angle not exceeding 45°, more preferably not exceeding 20°, without the contacts of the thermoelectric material legs breaking.

The invention also relates to the use of porous metallic materials for electrically conductive contact connection of thermoelectric material legs or for thermal contact connection of thermoelectric material legs to electrically nonconductive substrates.

In the porous metallic material, preferably metal foam, in accordance with the invention, preferably 99 to 20%, more preferably 99 to 50%, of the macroscopic volume is formed by metal. The remaining proportion by volume is accounted for by the pores. In other words, the porosity in the metallic material is preferably 1 to 80%, more preferably 1 to 50%. The metal foam may comprise closed or open pores. It is also possible for a mixture of closed and open pores to be present. Open pores are connected to one another.

The porosity can be determined, for example, by mercury porosimetry, especially for open-cell metallic materials such as metal foams. Otherwise, the porosity measurement can also be effected via a density measurement, in which the density of the metallic material is compared to the density of the compact metal.

The porosity, the pore size distribution and the proportion of continuous channels (corresponding to an open-cell foam) can be adjusted according to the practical requirements. The porosity should be sufficiently high that there is good mechanical flexibility of the metal (foam) contact. However, the porosity should not be too high, in order still to ensure good electrical and thermal conductivity through the metallic material. The suitable porosity can be determined by simple tests. The pore diameter can be adjusted, for example, through the production of the metal foam. For example, the metal foam can be produced proceeding from pellets, powder or a compactate of a metal powder. The mean pore diameter here is typically less than the mean particle diameter by a factor of 15 to 40, especially 20 to 30. The pellets, powder or compactate is/are sintered to give the metal foam.

In one process for producing the metal foam, a metal powder is subjected to shaping, in which the particles of the powder are bonded so as to form the porous structure. The powder can be processed, for example, by pressing, optionally in conjunction with a heat treatment, or by a sintering process or by a foam formation process.

In the course of processing by pressing, the powder is within a specific particle size distribution which ensures the desired porosity. The mean particle diameter for this application is preferably 20 to 30 times the desired mean pore diameter. The powder is pressed into a shape suitable for the contacts, or produced in any desired geometry which can then be cut into the desired shape.

The pressing can be performed, for example, as cold pressing or as hot pressing. The pressing may be followed by a sintering process.

The sintering process or sintered metal process involves first converting the metal powders to the desired shape of the shaped body, and then bonding them to one another by sintering, which gives the desired shaped body.

A foam formation process can be carried out in any suitable manner; for example, an inert gas is blown into a melt of the metal so as to result in a porous structure. The use of other blowing agents is also possible.

Foam can also be formed by vigorous beating, shaking, spraying or stirring of the melt of the metal.

In addition, it is possible in accordance with the invention to introduce the metal powder into a polymeric binder, to subject the resulting thermoplastic molding material to shaping, to remove the binder and to sinter the resulting green body. It is also possible to coat the metallic powder with a polymeric binder, and to subject it to shaping by pressing, optionally with heat treatment.

Further suitable processes for forming metal foams are known to those skilled in the art.

The nature of the surface of the metal foams is not restricted in accordance with the invention. A rough foam surface leads to tight intermeshing and increased contact area between TE material and contact connection material in the thermoelectric module.

The flexibility site is formed by the porous metallic material, for example metal foam, and may additionally have any suitable shape provided that the above-described function is fulfilled. The flexibility site is preferably in the form of at least one metallic material strand which, to increase flexibility, may additionally be present in a U-shaped, V-shaped or rectangular recess in the particular contact.

Alternatively, the flexibility site may preferably be in the form of a wave or spiral or in sawtooth form of the particular contact, if another increase in flexibility or bendability of the contact connection is needed compared to a metallic material strand, for example, in cuboidal form.

The inventive thermoelectric module is advantageous especially when the thermoelectric material legs are not arranged in planar form, or when the application necessitates an increased pressure onto the thermoelectric module for optimal function.

The inventive design of the thermoelectric material legs allows the spiral winding of the thermoelectric module onto a tube of any cross section. This cross section may be a rectangular, round, oval or other cross section.

According to the invention, the matching of the thermoelectric module to any desired three-dimensional surfaces of the heat exchange material is possible. Nonplanar heat sources or heat sinks are also amenable to a close connection to the thermoelectric module in this way.

Typically, waste heat or coolant is passed through a tube. In the case of use of thermoelectric modules for the conversion of automotive waste heat or exhaust gas waste heat, flexible and vibration-stable thermoelectric modules are needed.

The inventive configuration of compressibility, bendability and displaceability of the contacts allows better compensation for and dissipation of thermal and mechanical stresses.

By virtue of the windability of the thermoelectric modules, it is possible to wind a strand of alternating p- and n-legs about a round or oval tube without breaking of the contacts. This enables inexpensive, rapid and simple integration of thermoelectric components, for example, into the exhaust gas line of an automobile, into an automotive catalytic convertor, into a heating device, etc.

The invention also relates to a thermoelectric module composed of p- and n-conductive thermoelectric material legs which are connected to one another alternately via electrically conductive contacts and have thermal contact connection to electrically insulated substrates, wherein at least some of the thermally conductive contacts on the cold and/or the warm side of the thermoelectric module are formed between the thermoelectric material legs with electrical contact connection and an electrically insulated substrate composed of porous metallic materials.

According to the invention, it is thus also possible to achieve thermally conductive contacts between the thermoelectric materials and the electrically nonconductive substrates. Through the porous metallic material, for example the metal foam, this enables conduction of heat between substrate and thermoelectric material; see also the diagram in FIG. 1, which shows the substrate layers at the top and bottom, between which the thermoelectric materials together with their contact connections are embedded. The thermal connection to the substrates can, in accordance with the invention, be established via the porous metallic material. The metallic material enables compensation for thermal stresses in the material, as obtained as a result of heating or cooling of the thermoelectric elements.

For this application, the porous metallic material, for example the metal foam, preferably has such a structure as to result in a certain compressibility, for example of the foam, in which case the removal of an external pressure, for example on the foam, is followed by decompression, thus ensuring continuously good thermal contact connection of the thermoelectric leg to the substrate.

The use of metal foam leads, in comparison to the use, for example, of copper nonwoven, to another distinct improvement in electrical conductivity and thermal conductivity. There exists a continuous metal connection in a foam, but not in a nonwoven. As a result, the performance properties of the metal foam are once again distinctly superior to the performance properties of a metal nonwoven.

The porous metallic material, for example the metal foam, can be produced in accordance with the invention from all thermally and electrically conductive metals. The porous metallic material preferably comprises copper, silver, aluminum, iron, nickel, molybdenum, titanium, chromium, cobalt or mixtures thereof. When the porous metallic material gives rise to the electrically conductive contacts, it may also be formed from the materials listed below.

The electrically conductive contacts may be formed from any suitable materials. They are typically formed from metals or metal alloys, for example iron, nickel, aluminum, platinum or other metals. Sufficient thermal resistance of the electrical contacts should be ensured, especially when the thermoelectric modules are frequently exposed to high temperatures above 500° C.

The mechanical strength can be increased further by embedding the thermoelectric material legs into a solid, electrically nonconductive matrix material.

In order to keep the thermoelectric material stably in a wound form, it is advisable to use a matrix or a grid to stabilize the thermoelectric module. For this purpose, preference is given to using materials with low thermal conductivity and zero electrical conductivity. Examples of suitable materials are aerogels, ceramics, particularly foamed ceramics, glass wool, glasses, glass-ceramic mixtures, electrically insulated metal grids, mica, organic polymers (polyimide, polystyrene, polyester, polyether, etc.) or a combination of these materials. For the temperature range up to 400° C., it is also possible to use synthetic polymers based on carbon, such as polyurethanes, polystyrene, polycarbonate, polypropylene, or naturally occurring polymers such as rubber. The matrix materials can be used in the form of powder, in the form of shaped bodies, in the form of suspension, in the form of paste, in the form of foam or in the form of glass. A heat treatment or (UV) irradiation can harden the matrix, as can evaporation of the solvents, or crosslinking of the materials used. The matrix or the grid can be matched to the appropriate application by shaping before use, or cast, sprayed or applied in the course of use.

The electrical contacts can be connected in any desired manner to the thermoelectric material legs. They can, for example, be applied beforehand to the thermoelectric legs, for example by being placed on, pressed on, pressed, sintered, hot pressed, soldered on or welded on, before incorporation into a thermoelectric module, and they can also be applied to the electrically insulating substrate. In addition, it is possible to press them, to solder them together or to weld them in a one-step process together with the electrically insulated substrates and the thermoelectric legs.

A stable connection to an elevated contact area can be established as follows: first, the electrical contact is inserted into a mold which may be formed, for example, from graphite, glazed graphite, metal alloys of high thermal stability, quartz, boron nitride, ceramic or mica. Then a separator wall is inserted at right angles to the contact, and p- and n-thermoelectric materials are inserted into the two chambers formed. The thermoelectric material can be inserted directly in the form of finished legs, or can be poured in as a powder or melt. In the case of use of powder, the thermoelectric material together with the electrical contact should be brought to melting temperature in the mold for a short time, preferably 1 minute to 1 hour. Subsequently, by means of a sintering step, the electrically contact connected thermoelectric legs are completed. When the thermoelectric material is cast from the melt, a sintering step in the mold is also advantageous. Preference is given to working at sintering temperatures of 100 to 500° C. below the melting point of the thermoelectric material and with sintering times of 0.5 to 72 hours, more preferably 3 to 24 hours. The separator wall between the p- and n-legs may either be an organic compound, for example based on polymer, which is burnt out during the sintering, or a thermally stable material which is electrically insulating and is preserved within the module. Materials of high thermal stability, such as oxidic materials, nitrides, borides and mica, are known to those skilled in the art. The production also enables double-sided contact connection of the legs when the electrical/thermal contact is placed into the lower part of the mold and contacts are connected in an offset manner via the thermoelectric legs, so as to obtain an electrical series connection.

Preferably, one or more protective layers are first applied to the thermoelectric materials, and then the contacts made of porous metallic materials are attached. The metal foam contacts may serve either as flexible electrical contacts, or merely as flexible heat conductor bridges. The metal foam contacts can be applied as a foam, or as a metal bridge which is foamed in situ. In situ production of the foam can simplify the application of the contacts to the thermocouples, since no further connecting steps are needed in the case of direct foaming.

According to the invention, at least some of the electrically conductive contacts may be formed from porous metallic materials, for example metal foam. This means that not all contacts need be formed from metal foam. When, for example, a thermoelectric generator in ribbon form is to be applied to a tube of cuboidal cross section by winding, flexible contacts are needed only on the corners of the cuboid. Preferably at least half, more preferably at least 85%, of the electrically conductive contacts are formed from porous metallic materials, for example metal foam. In one embodiment, all electrically conductive contacts are formed from metal foam.

In addition, it is possible to distinguish between contact connection with the cold side and with the warm side of the thermoelectric module. For example, only the contacts on the cold side or on the warm side of the thermoelectric module may be formed from porous metallic materials, for example metal foam. It is also possible to use different materials for the cold side of the module and the hot side of the module. For use on the cold side of the module, it is possible, for example, to use any metal foam with a good thermal conductivity and, if desired, also a good electrical conductivity. For use on the hot side of the module, good thermal stability of the contact material is necessary.

The thermoelectrically contact connected legs can be contact connected to the heat carrier medium in any suitable manner. The thermoelectric module can, for example, be wound externally, i.e. around an electrically insulated tube, or else internally, i.e. on an inner carrier mounted within the tube. The inner carrier may be an electrically insulating coating.

In addition, the thermoelectric module (thermoelectric leg, electrically contact connected in series) may be encapsulated into an electrically insulated metal, ceramic, glass, or mixtures thereof, and then introduced directly into a heat transfer medium or refrigerant medium.

Typically, contacts are established either with heat transfer media for cooling purposes, or with heated exhaust gases from heating plants or from internal combustion engines. However, it is also possible to place the thermoelectric modules for utilization of waste heat onto the non-mirror side of the parabolic troughs in photovoltaic systems.

The invention accordingly also relates to the use of the thermoelectric modules for application to uneven, solid heat carrier surfaces and exhaust gas lines with thermoelectric modules wound thereon in spiral form, as described above.

The invention also relates to a process for producing thermoelectric modules as described above, by applying the thermally or electrically conductive contacts composed of porous metallic materials to the thermoelectric material legs by pressing, soldering, welding or foaming.

The invention additionally relates to a process for producing thermoelectric modules as described above, by pressing a powder of the thermoelectric material onto the contacts composed of porous metallic materials and then sintering.

The advantages of the use of metal foam or metal nonwoven are:
  flexible contact connection is enabled;
  thermal stress as a result of thermal expansion is dissipated;
  the porous surface at the contact boundary gives a higher contact area;
  better contacting or connection between electrical contact and thermoelectric leg is achieved by virtue of crosslinking or penetration of the thermoelectric powder or of the thermoelectric melt with the surface/into the surface of the metal nonwoven or metal foam;
  the porous structure of the contacts dissipates mechanical stresses in the contact boundary.

The semiconductor materials described above can also be joined together by methods to give thermoelectric generators or Peltier arrangements which are known per se to those skilled in the art and are described, for example, in WO 98/44562, U.S. Pat. No. 5,448,109, EP-A-1 102 334 or U.S. Pat. No. 5,439,528.

The present invention also relates to the use of a thermoelectric generator or of a Peltier arrangement:

as a heat pump
for climate control of seating furniture, vehicles and buildings
in refrigerators and (laundry) driers
for simultaneous heating and cooling of streams in processes for substance separation such as
   absorption
   drying
   crystallization
   evaporation
   distillation
as a generator for utilization of heat sources such as
   solar energy
   geothermal heat
   heat of combustion of fossil fuels
   waste heat sources in vehicles and stationary units
   heat sinks in the evaporation of liquid substances
   biological heat sources
for cooling electronic components.

The present invention further relates to a heat pump, to a refrigerator, to a (laundry) drier or to a generator for utilizing heat sources, comprising at least one inventive thermoelectric generator or one inventive Peltier arrangement, by means of which, in the case of the (laundry) drier, a material to be dried is heated directly or indirectly and by means of which the water or solvent vapor obtained in the drying is cooled directly or indirectly.

In a preferred embodiment, the drier is a laundry drier, and the material to be dried is laundry.

The invention claimed is:

1. A thermoelectric module comprising:
alternating p- and n-conductive thermoelectric material legs which are connected to one another via electrically conductive contacts, wherein at least some of the electrically conductive contacts are composed of porous metallic materials on a cold side and/or a warm side of the thermoelectric module and are embedded into the p- and n-conductive thermoelectric material legs, whereby the porous metallic materials are provided for electrically conductive contact connection of the thermoelectric materials legs or for thermal contact connection of the thermoelectric materials legs to electrically non-conductive substrates, whereby by virtue of the porous metallic materials, the thermoelectric material legs have flexible sites in the profiles thereof, which allow bending of the thermoelectric material legs with respect to one another by an angle not exceeding 45° without the contacts of the thermoelectric material legs breaking.

2. The thermoelectric module according to claim 1, wherein the porous metallic materials comprise Cu, Ag, Al, Fe, Ni, Mo, Ti, Cr, Co or mixtures thereof.

3. The thermoelectric module according to claim 1, wherein the porous metallic materials are selected from metal foam, metal nonwovens, metal wovens or metal knits, and wherein the metal foam can be produced by any suitable process and the metal nonwovens, metal wovens, or metal knits are produced from nanowires or nanotubes by electrospinning.

4. A thermoelectric module comprising:
alternating p- and n-conductive thermoelectric material legs connected to one another via electrically conductive contacts, having thermal contact connection to electrically insulated substrates, wherein at least some of the thermally conductive contacts are composed of porous metallic materials on a cold side and/or a warm side of the thermoelectric module and are formed between the p- and n-conductive thermoelectric material legs with an electrical contact connection and an electrically insulated substrate, wherein the porous metallic materials are provided for electrically conductive contact connection of the thermoelectric materials legs or thermal contact connection of the thermoelectric materials legs to electrically non-conductive substrates, whereby by virtue of the porous metallic materials, the thermoelectric material legs have flexible sites in the profiles thereof, which allow bending of the thermoelectric material legs with respect to one another by an angle not exceeding 45° without the contacts of the thermoelectric material legs breaking.

* * * * *